US006226864B1

United States Patent
Muziol et al.

(10) Patent No.: US 6,226,864 B1
(45) Date of Patent: *May 8, 2001

(54) PROCESS FOR PRODUCING PRINTED CIRCUIT BOARDS WITH AT LEAST ONE METAL LAYER, PRINTED CIRCUIT BOARD AND USE THEREOF

(75) Inventors: Matthias Muziol, Seligenstadt; Karlheinz Wienand, Aschaffenburg, both of (DE)

(73) Assignee: Heraeus Electro-Nite International N.V., Houthalen (BE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/908,608

(22) Filed: Aug. 8, 1997

(30) Foreign Application Priority Data

Aug. 20, 1996 (DE) .............................................. 196 33 486

(51) Int. Cl.[7] .................................................... H01R 9/00
(52) U.S. Cl. ................................ 29/843; 29/412; 29/415; 228/248.1; 228/246
(58) Field of Search ............................. 29/843, 842, 412, 29/415; 228/124.5, 248.1, 246, 254, 256

(56) References Cited

U.S. PATENT DOCUMENTS

| | | | |
|---|---|---|---|
| 3,332,912 | * | 7/1967 | Stricker et al. .................... 174/50.52 |
| 3,882,059 | * | 5/1975 | Elderbaum ........................... 29/25.42 |
| 3,916,515 | * | 11/1975 | Walsh et al. ............................ 29/626 |
| 4,312,896 | * | 1/1982 | Armstrong .............................. 427/96 |
| 4,434,134 | * | 2/1984 | Darrow et al. ............................ 419/5 |
| 4,525,644 | * | 6/1985 | Frohlich ............................... 310/328 |
| 4,562,121 | | 12/1985 | Thiemann et al. . |
| 4,759,490 | * | 7/1988 | Ochiai ................................... 228/124 |
| 5,027,505 | * | 7/1991 | Nakamura .............................. 29/832 |
| 5,280,850 | * | 1/1994 | Horiguchi et al. ................. 228/122.1 |
| 5,661,086 | * | 8/1997 | Nakashima et al. .................. 257/668 |
| 5,729,896 | * | 3/1998 | Dalal et al. ............................ 29/840 |
| 5,778,520 | * | 7/1998 | Kim et al. .............................. 29/827 |

FOREIGN PATENT DOCUMENTS

| | | |
|---|---|---|
| 24 10 849 B2 | 12/1979 | (DE) . |
| 80 03 431 | 5/1980 | (DE) . |
| 30 02 112 A1 | 7/1981 | (DE) . |
| 33 45 219 C1 | 3/1985 | (DE) . |
| 38 38 968 A1 | 7/1989 | (DE) . |
| 41 13 335 C1 | 11/1992 | (DE) . |
| 41 23 251 C2 | 3/1994 | (DE) . |

* cited by examiner

Primary Examiner—Lee Young
Assistant Examiner—Minh Trinh
(74) Attorney, Agent, or Firm—Akin, Gump, Strauss, Hauer & Feld, L.L.P.

(57) ABSTRACT

A printed circuit board has a conductor path applied to a substrate having an electrically insulating surface, the conductor path preferably being constructed in the shape of a meander and containing connection areas with holes to which small contact plates are applied for the purpose of later bonding with connection leads. The small contact plates are applied in a hard soldering process with the aid of solder paste to the connection areas of the conductor paths and to the surface area of the substrate surface which is made of ceramic and exposed by the holes. It is consequently possible, dispensing with so-called bonding wires, to directly connect connection leads or bonding lugs electrically with the conductor path and mechanically with the printed circuit board. The printed circuit board is preferably designed as a measuring resistor, wherein the conductor path is applied as a resistance layer of platinum or platinum group metal in a thin film process to a small ceramic plate of aluminum oxide. The small contact plates are preferably made of nickel or a nickel-iron alloy, whereby a good stability results at high temperatures.

11 Claims, 2 Drawing Sheets

PROCESS FOR PRODUCING PRINTED CIRCUIT BOARDS WITH AT LEAST ONE METAL LAYER, PRINTED CIRCUIT BOARD AND USE THEREOF

BACKGROUND OF THE INVENTION

The invention relates to a process for producing a printed circuit board with at least one conductor path applied as a metal layer on at least one electrically insulated surface of a substrate board, wherein the printed circuit board has connection areas for connection contacts. The invention also relates to a printed circuit board and uses therefor.

A measuring resistor for resistor thermometers is known from German Utility Model 80 03 431, which has a small ceramic board on which a thin resistance layer is applied. The lead-in wires necessary for electrical bonding are passed through borings of an insulating body and are melted onto the small ceramic board along with this resistance layer by means of a glass frit, whereby the resistance path is covered with a burned-in insulation layer of glass ceramic. The comparatively complex construction, which is hardly suited for a mass production of economical measuring resistors measuring resistors, proves to be problematic with the known arrangement.

Furthermore, from DE 30 02 112 A1, a paste with predetermined electrical conductivity is known in which an electrically non-conducting support material is provided with additives in order to attain a specified conductivity. Such a paste is used, for example, as a contact and solder mass for layer circuits in heating elements or sensors. It can be applied in usual processing procedures as, for example, screen printing.

In practice, such terminals applied in screen printing turn out to be suitable only for connection with thin wires and bonding wires or thin bands in a soft soldering process, owing to their slight layer thickness. When using standard connection wires, as are usual for cable connections, a poor mechanical fixation between connection wire or cable lead and the contact field on the substrate must be taken into consideration, from which a rapid separation can result, especially at elevated temperature or with mechanically high tensile stress. When using a thin bonding wire, this must then be lengthened further, from which difficulties can result in automated processes.

BRIEF SUMMARY OF THE INVENTION

An object of the invention is to create a printed circuit board with a metallic conductor path in thin or thick layer technology with connection positions such that a typical connection contact of a connection lead can be directly plugged in, or a stranded wire can be directly hard soldered or directly welded on. The wire or stranded wire should, in addition, satisfy standard macroscopic connection technology, that is, be jacketed with desired insulation material, as for example fiberglass or silicone. Furthermore, usages of such a printed circuit board are provided.

The object is accomplished in accordance with the invention by a process including the steps of applying connection areas of a conductor path to a substrate having a ceramic surface, such that holes are formed in connection areas to expose areas of the substrate surface, applying active solder to the connection areas, subsequently applying a small contact plate to each connection area as a connection contact covering the active solder, and soldering the small contact plates to the conductor path and to the areas of the substrate surface exposed by the holes of the connection areas.

It also proves advantageous that the small contact plates provided for subsequent connection contacts be connected directly with the electrically insulated surface of the substrate through holes of connection areas, so that a firm connection results.

In a preferred embodiment of the process, the small contact plate is applied as a connection lug. Here the simple connectivity to a structural connection proves to be advantageous.

In a preferred configuration of the process, auxiliary and carrier strips for the metallic parts (contact plates) are removed by sawing, breaking and tearing off. Further advantageous configurations of the process are presented in dependent claims. The active solder may be applied as a paste, as a shaped solder part, or as a plated-on layer of a small contact plate. The solder may be applied as a dispensable material by means of a dosing facility.

It has proved advantageous, furthermore, to have the comparatively simple application of contact surfaces with a plurality of measurement elements in the form of a multi-unit panel on a continuous ceramic substrate in a single process step. Above and beyond this, a statistical quality control is possible in an especially simple manner, since all measuring resistors are contacted according to the same process.

The object is further accomplished in accordance with an arrangement for a printed circuit board wherein the connection areas of the conductor path have holes with exposed areas of a substrate having a ceramic surface, the connection areas and the areas of the substrate exposed by the holes being firmly connected electrically and mechanically by active solder to small contact plates applied as connection contacts using a protective gas or vacuum soldering process.

Simple external contacting proves to be advantageous, so that now standard connection wires or stranded wires can be directly hard soldered or welded with the contacts of the printed circuit board, from which a simple assembly and a high reliability result.

In a preferred embodiment, the small contact plates are made of a nickel or nickel-iron alloy, from which good temperature stability, good sweat solderability and a low contact resistance advantageously result.

The electrically insulating surface of the substrate preferably comprises aluminum oxide ceramic. The holes of the connection areas applied to the substrate surface are constructed in the form of window-shaped openings, so that a secure and stable connection between the ceramic, and the soldered-on contact plate arises. Advantageous configurations of the printed circuit board are presented in dependent claims.

The object is further accomplished in accordance with usage of the printed circuit board as a measuring resistor or heating element wherein the printed circuit board is constructed as a resistance, or usage for capacitance measurements wherein the printed circuit board is constructed as an electrode structure.

When using the printed circuit as a measuring resistor, the rapid response time proves to be particularly advantageous, since the conductor path as thin layer element contains only a low thermal inertia.

The conductor path is applied in an advantageous configuration as a thin layer or thin film of platinum group metals in a photolithographic process.

BRIEF DESCRIPTION OF THE SEVERAL VIEWS OF THE DRAWING

The foregoing summary, as well as the following detailed description of preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1A:
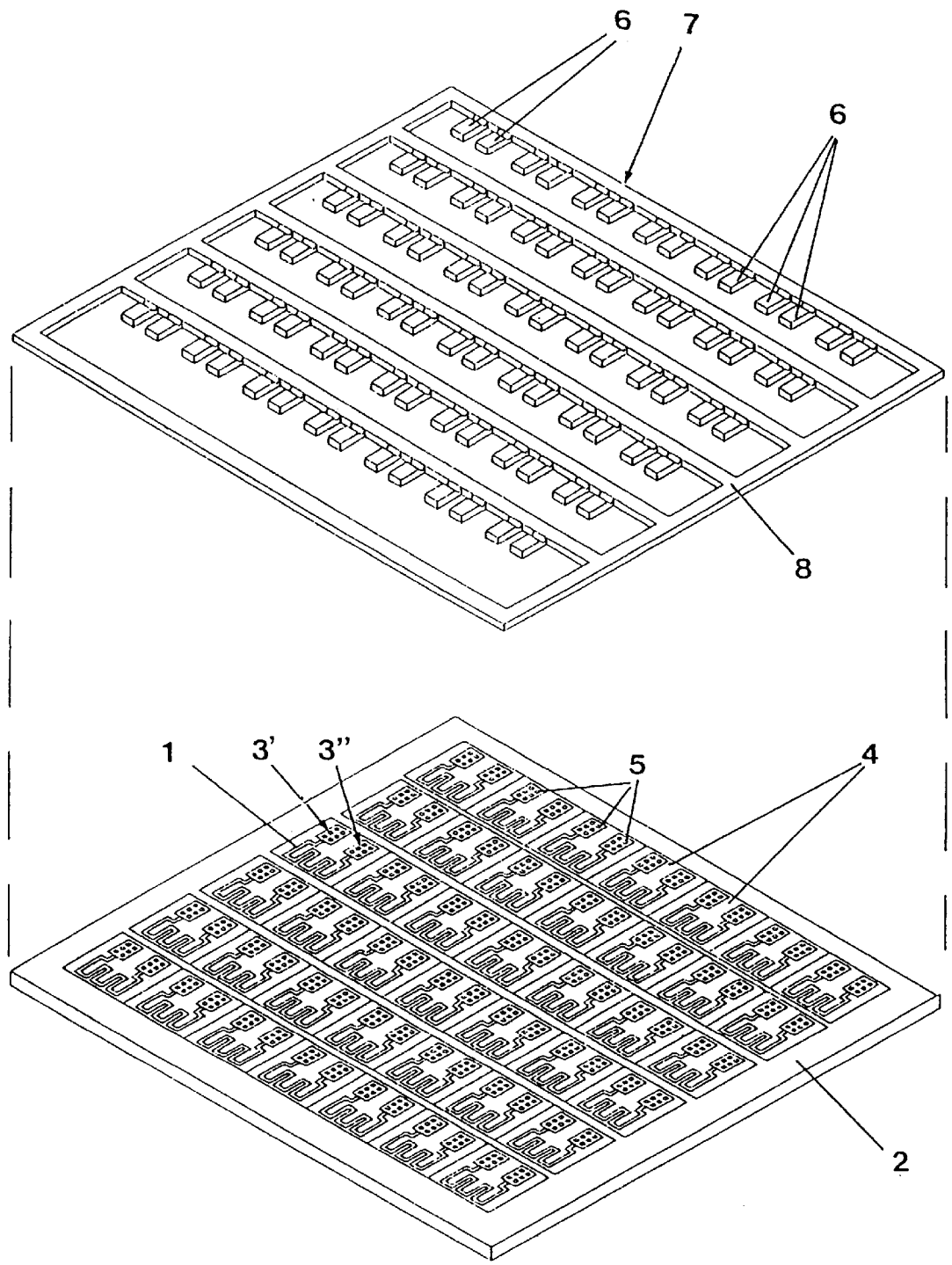
FIG. 1a depicts printed circuit board elements constructed as measuring resistors on a continuous substrate board, which forms a so-called multi-unit panel, wherein a metallic contact preform with small contact plates is to be applied to connection areas of the conductor paths constructed as resistances. The contact preform is preferably constructed as a stamped part, but it can also be manufactured by etching, eroding or laser treatment.
Figure 1B:
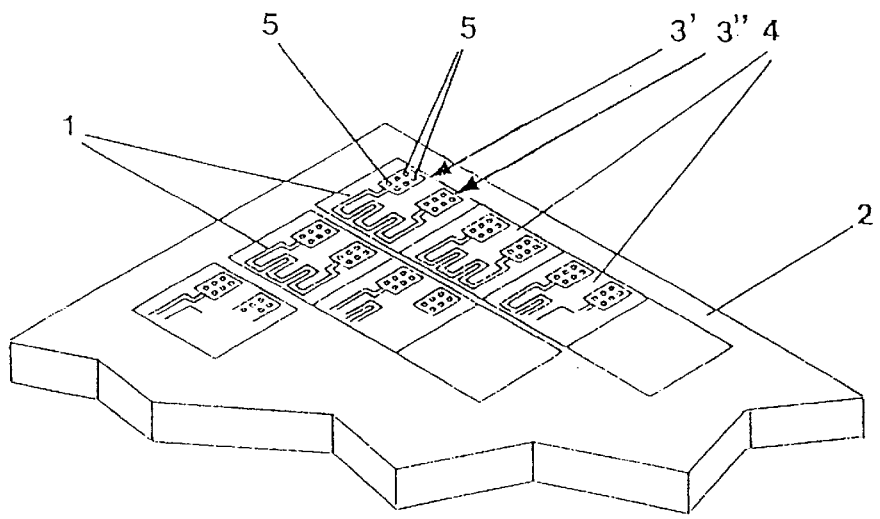
FIG. 1b shows in a fragmentary section of the multi-panel the surface arrangement of the meander-shaped structure of the conductor path as resistance layer together with its connection areas with window-shaped holes in a purely schematic representation.

In accordance with FIG. 1a, the individual printed circuit boards 4 as preforms, provided in each case with a resistance layer as conductor path 1, are situated in a field arrangement on a continuous substrate board 2 of ceramic, whereby this arrangement is also designated as a multi-unit panel. The resistance layers or conductor paths 1 in accordance with the schematic representation in FIG. 1b, can be constructed in a meander-shaped structure, wherein they are provided on respective ends with two connection areas 3', 3" lying beside each other, which for their part have window-shaped holes 5 which expose the surface of the substrate board 2. The connection areas 3', 3" are provided with active solder, whereupon small contact plates 6 are subsequently soldered to the connection areas 3', 3" as well as to the surface of the substrate board 2, made of ceramic, exposed by the holes 5. That is, these connection areas 3', 3" should be provided with their own small contact plates 6 for purposes of subsequent bonding with connections leads (not depicted here), for example in the form of cable ends, which make possible a soldering or welding with connection leads. For this purpose, the substrate board 2 or the panel is at least partially covered by a metallic contact preform 7. As can be gathered from FIG. 1a, the metallic contact preform 7 has a frame 8, which contains a plurality of prefabricated soldering surfaces or small contact plates 6 to be applied, which according to FIG. 1a are to be applied to the connection areas of the respective printed circuit boards 4 (for example, measuring resistors) provided for connection, such that the connection areas 3', 3" are covered altogether by the small contact plates 6. The metallic contact preform 7 preferably comprises nickel or a nickel-iron alloy.

Prior to connection of the soldering surfaces or small contact plates 6 with the connection areas 3', 3" of the conductor path 1, a solder paste is applied to the parts of the conductor paths 1 or resistance layers provided as connection areas 3', 3" in a screen printing process, whereby the surfaces of the connection area printed in the screen printing correspond at least to the surfaces of the subsequently applied small contact plates 6 which touch the substrate board.

In a preferred configuration of the process, a paste containing platinum metal is applied in an additional process step by screen printing for improved electrical connection of the small contact plates between the connection areas 3', 3" of the conductor paths and the active solder paste. After applying the metallic contact preform 7, the multi-unit panel thus prepared, that is, the small contact plates and substrate board 2 is placed in a vacuum or protective gas soldering oven, and by means of heat conduction the soldering surfaces or small contact plates 6 are firmly connected electrically and mechanically with the active solder paste applied by screen printing in the connection areas 3', 3" of the conductor path 1.

Figure 2A:
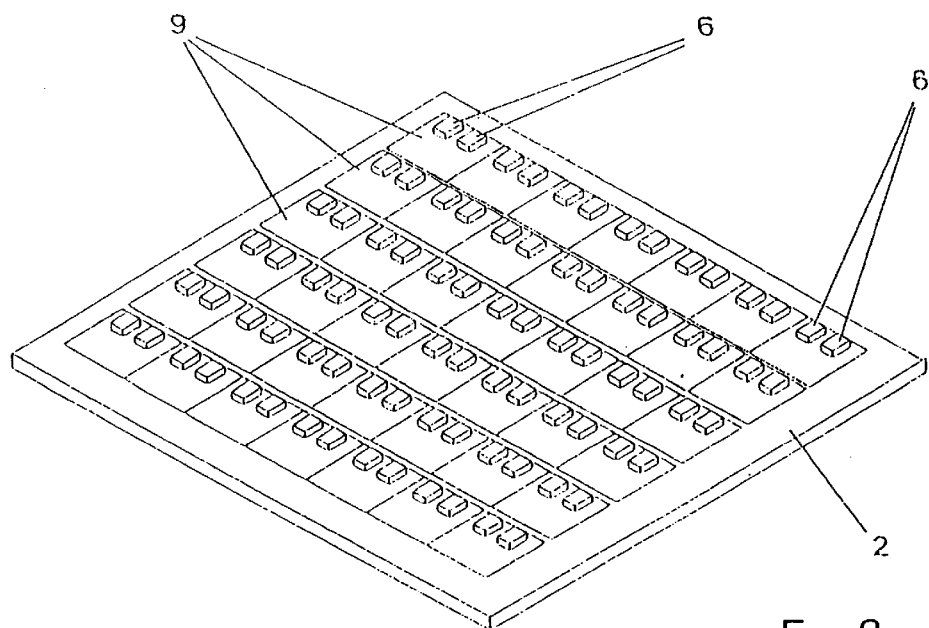
FIG. 2a depicts the multi-unit panel provided with soldered-on contact elements prior to separation.
Figure 2B:
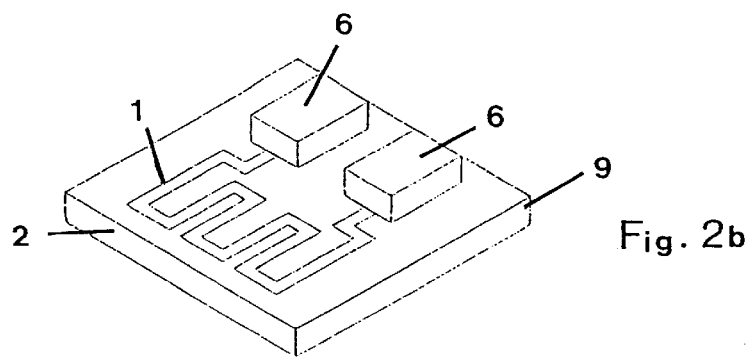
FIG. 2b illustrates a printed circuit board after separation.

After firm connection between contact surfaces 6 and the connection areas 3', 3" as well as the substrate surface areas of the printed circuit board exposed by the holes 5, the auxiliary and carrier strips of the metallic contact preform 7 in FIG. 2a are removed, and after separation of the original printed circuit board preforms, which are now designated with number 9 in FIG. 2b, a connection-ready printed circuit board is available as a measuring resistor with substrate. The separation of the original printed circuit board preform takes place through sawing or breaking.

Following separation, the small contact plates 6 connected with the connection areas of the conductor path stand ready for a secure and reliable high temperature-stable bonding of the printed circuit board 9 with connection leads.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A process for producing a printed circuit board with at least one conductor path applied as a metal layer to at least one electrically insulated ceramic surface of a substrate board, wherein the conductor path has connection areas for connection contacts, comprising applying the connection areas (3', 3") to the ceramic surface such that holes (5) which expose areas of the ceramic surface are formed in the connection areas (3', 3"), applying active solder to the connection areas (3', 3"), subsequently applying a small contact plate (6) to each connection area (3', 3") as a connection contact covering the active solder, and soldering the small contact plates to the conductor path and to the areas of the ceramic surface exposed by the holes (5) of the connection areas.

2. The process according to claim 1, wherein the small contact plate is applied as a connection lug.

3. The process according to claim 1, wherein the small contact plate is applied as an end of an extended lead.

4. The process according to claim 1, wherein the active solder is applied as a paste, shaped solder part or as a plated-on layer of a small contact plate.

5. The process according to claim 1, wherein the active solder is applied as a dispensable material applied by means of a dosing facility.

6. The process according to claim 4, wherein the active solder is applied in a screen printing process as an electrically conducting paste at least partially to the conductor path, and the active solder contains a platinum group metal.

7. The process according to claim 1, wherein the conductor path (1) is applied to the ceramic substrate (2) in the form of a multi-unit panel.

8. The process according to claim 7, wherein a metallic contact preform (7) with small contact plates (6) is applied covering the active solder.

9. The process according to claim 1, wherein the small contact plates (6) are soldered in a vacuum or in an inert gas atmosphere with the active solder paste.

10. The process according to claim 8, further comprising the steps of removing auxiliary or carrier strips of the metal contact preform (7) by sawing, breaking, or tearing off for separation, and separating individual printed circuit boards from the panel by sawing or breaking.

11. A process for producing a printed circuit board with at least one conductor path applied as a metal layer to at least one electrically insulated ceramic surface of a substrate board, wherein the conductor path has connection areas for connection contacts, comprising applying the connection areas (3', 3") to the ceramic surface, such that holes (5) which expose areas of the ceramic surface are formed in the connection areas (3', 3"), applying active solder to the connection areas (3', 3"), wherein the active solder comprises a platinum group metal and is applied in a screen printing process as an electrically conducting paste to at least a part of the conductor path, subsequently applying a small contact plate (6) to each connection area (3', 3") as a connection contact covering the active solder, and soldering the small contact plates to the conductor path and to the areas of the ceramic surface exposed by the holes (5).

\* \* \* \* \*